(12) United States Patent
Ikeda

(10) Patent No.: US 6,417,599 B2
(45) Date of Patent: Jul. 9, 2002

(54) PIEZOELECTRIC RESONATOR, PIEZOELECTRIC COMPONENT, AND PRODUCING METHOD FOR THE PIEZOELECTRIC RESONATOR

(75) Inventor: Yoshihiro Ikeda, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/841,793

(22) Filed: Apr. 25, 2001

(30) Foreign Application Priority Data

Jun. 12, 2000 (JP) .................................. 2000-175736

(51) Int. Cl.⁷ .......................... H01L 41/08; H03H 9/15
(52) U.S. Cl. ........................... 310/327; 310/321
(58) Field of Search ............................. 310/321, 326, 310/327

(56) References Cited

U.S. PATENT DOCUMENTS

| | | | | |
|---|---|---|---|---|
| 3,821,834 A | * | 7/1974 | McElroy | 29/25.35 |
| 4,326,274 A | * | 4/1982 | Hotta et al. | 310/317 |
| 5,343,109 A | * | 8/1994 | Mockl | 310/317 |
| 5,452,264 A | * | 9/1995 | Holroyd | 310/322 |
| 5,457,352 A | * | 10/1995 | Muller et al. | 310/327 |
| 5,664,456 A | * | 9/1997 | Eckert | 310/324 |
| 6,142,015 A | * | 11/2000 | Getman et al. | 340/621 |

FOREIGN PATENT DOCUMENTS

| | | | | |
|---|---|---|---|---|
| DE | 30 13 482 A1 | * | 10/1981 | G01F/1/66 |
| EP | 0 940 800 A2 | * | 9/1999 | G10K/9/122 |
| JP | 7-235853 | | 9/1995 | H03H/9/02 |

* cited by examiner

Primary Examiner—Thomas M. Dougherty
(74) Attorney, Agent, or Firm—Keating & Bennett, LLP

(57) ABSTRACT

A piezoelectric resonator utilizes a thickness shear vibration mode, which allows for simplification of the manufacturing process, effectively suppresses ripples in the width mode, has superior frequency characteristics and is inexpensive. This piezoelectric resonator includes a pair of vibration electrodes provided on portions of first and second main surfaces, respectively, of a piezoelectric substrate, and a damping member arranged so as to cover a vibrating portion only on one main surface of the piezoelectric resonator and a pair of side surfaces connecting the first and second main surfaces.

20 Claims, 7 Drawing Sheets

PIEZOELECTRIC RESONATOR, PIEZOELECTRIC COMPONENT, AND PRODUCING METHOD FOR THE PIEZOELECTRIC RESONATOR

BACKGROUND OF THE INVENTION

1. Field of the Invention

The present invention relates to a piezoelectric resonator used for e.g., discriminators or trap filters, and more particularly, to an energy-trap type piezoelectric resonator utilizing the thickness shear vibration mode, and also relates to a method of manufacturing the same. The present invention further relates to a piezoelectric component including this piezoelectric resonator.

2. Description of the Related Art

In a conventional piezoelectric component such as a discriminator or a trap filter utilizing the thickness shear vibration mode, a piezoelectric resonator is mounted in the accommodating space of a case. The energy-trap type piezoelectric resonator utilizing the thickness shear vibration mode has vibration electrodes that are provided on portions of the two main surfaces of a piezoelectric substrate so as to be opposed to each other. In order to provide desired values for electrical characteristics such as resonance characteristics, group delay characteristics, or distortion factor in the piezoelectric resonator, a method for providing both main surfaces of the piezoelectric substrate with a damping member made of silicone rubber has been widely used. One example is disclosed in Japanese Unexamined Patent Application Publication No. 7-235853.

In the conventional piezoelectric resonator, however, since there is a need to provide both main surfaces of the piezoelectric substrate with a damping member, the processes of applying the damping member must be executed twice. This raises a problem that the number of the manufacturing steps for a piezoelectric resonator or a piezoelectric component using this piezoelectric resonator increases, thereby increasing the cost thereof.

SUMMARY OF THE INVENTION

In order to overcome the problems described above, preferred embodiments of the present invention provide a low-cost piezoelectric resonator which is easily producible and which has superior electrical characteristics, and further provide a method of manufacturing such a novel piezoelectric resonator, as well as a piezoelectric component including this piezoelectric resonator.

In accordance with a first preferred embodiment of the present invention, an energy-trap type piezoelectric resonator which utilizes the thickness shear mode includes a piezoelectric substrate, and at least a pair of vibration electrodes which are provided on portions of first and second main surfaces, respectively, of the piezoelectric substrate, which are arranged so as to be opposed to each other, and which constitute a vibrating portion. The piezoelectric resonator further includes a damping member which is arranged so as to cover the vibrating portion only on one main surface of the piezoelectric resonator and a pair of side surfaces connecting the first and second main surfaces thereof.

In the first preferred embodiment of the present invention, it is preferable that the damping member is made of silicone rubber which has a viscosity of about 20 Pa·s or below at approximately 25° C., which has fluidity at about 25° C., and which is cured into a rubber-like state by heating. In this specification, the viscosity is a value measured in accordance with the method defined by JIS K6249.

In accordance with a second preferred embodiment of the present invention, a piezoelectric component includes a piezoelectric resonator in accordance with the first preferred embodiment of the present invention, and first and second case members which are bonded to each other, and in which an accommodating space for accommodating the piezoelectric resonator is provided. In this piezoelectric component, the piezoelectric resonator is fixed on one of the first and second case members so as not to hinder vibrations of the piezoelectric vibrating portion.

In accordance with a third preferred embodiment of the present invention, a method for manufacturing a piezoelectric resonator includes the steps of preparing an energy-trap type piezoelectric resonator which utilizes the thickness shear mode and in which the vibration electrodes are formed on the first and second main surfaces thereof, respectively, applying a damping member from one main surface side of the piezoelectric resonator and so as to coat the damping member on the vibrating portion only on one main surface and both side surfaces.

In the third preferred embodiment of the present invention, the step of applying of the damping member is preferably performed using a nozzle or a transfer pin.

Preferably, a nozzle or a transfer pin which satisfies the relationship $D \geq W$ is used, when the widthwise dimension of the piezoelectric substrate is W, and the outer diameter of the nozzle or the diameter of the transfer pin is D, at the portion where the damping member droops from the tip of the nozzle or the transfer pin.

In the third preferred embodiment of the present invention, more preferably, the damping member is provided so as to satisfy the relationship $0 \leq A \leq t$, when the distance between the lower end of the portion where the damping member droops from the tip of the nozzle or the transfer pin and the main surface opposite to the main surface on the side where the damping member of the piezoelectric substrate is to be applied, is A, and the thickness of the piezoelectric substrate is t.

The above and other elements, characteristics, features, and advantages of the present invention will be clear from the following detailed description of the preferred embodiments of the invention in conjunction with the accompanying drawings.

DETAILED DESCRIPTION OF THE PREFERRED EMBODIMENTS

Figure 1:
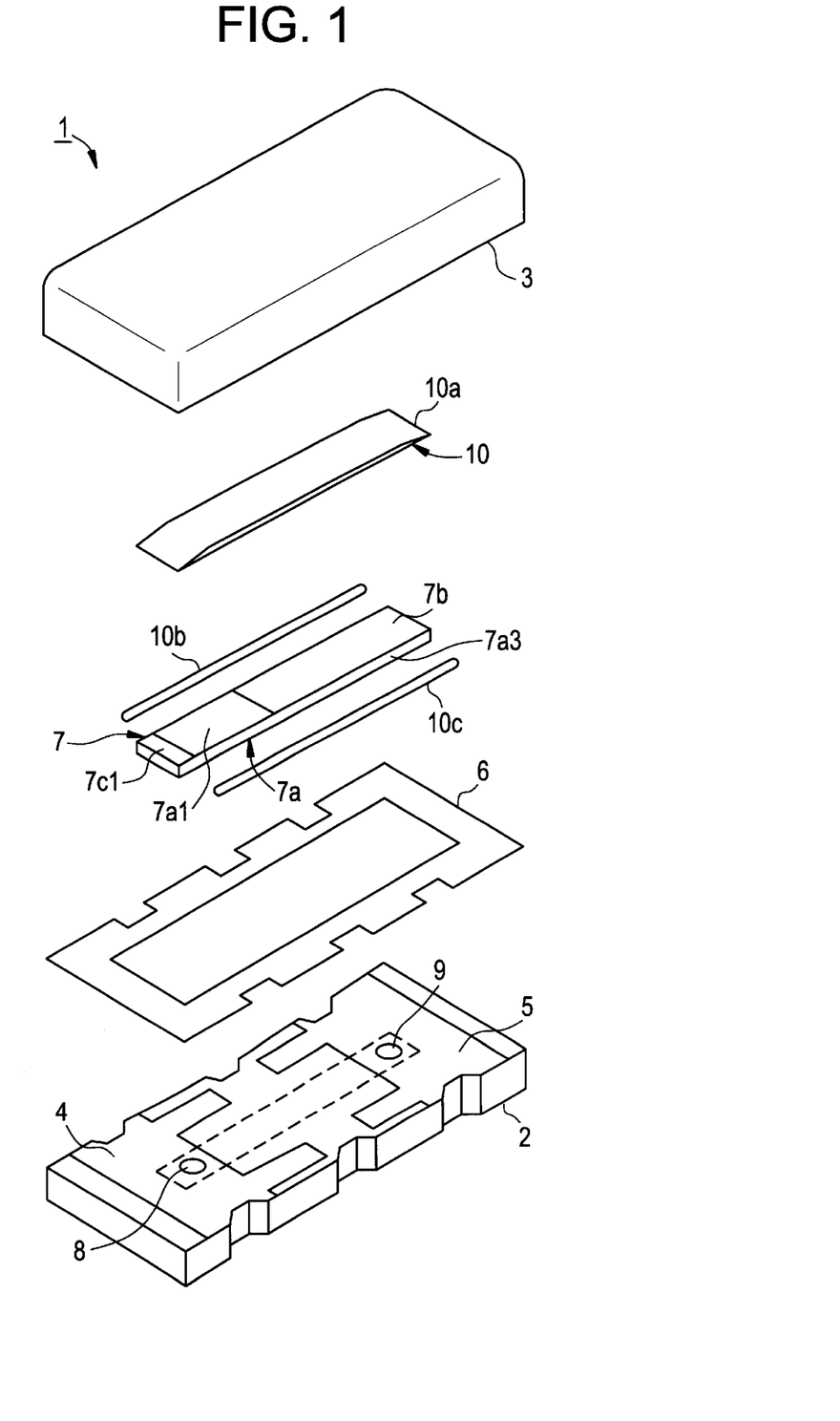
FIG. 1 is an exploded perspective view for explaining a piezoelectric component in accordance with a preferred embodiment of the present invention.

FIG. 1 is an exploded perspective view for explaining a piezoelectric component in accordance with a preferred embodiment of the present invention. In a piezoelectric component 1, a case board 2 defining a first case member and a cap 3 defining a second case member constitute a package.

The case board 2 is preferably made of an insulative ceramic such as alumina, or a suitable conductive material such as a synthetic resin. On the top surface of the case board 2, electrodes 4 and 5 are provided.

On the other hand, the cap 3 is preferably made of metal, and has an opening open at the bottom. The cap 3 is bonded to the case board 2 via an insulative adhesive layer 6 having a substantially rectangular frame shape. In this manner, a package is constituted of the case board 2 and the cap 3, and an accommodating space sealed in this package is provided.

On the case board 2, an energy-trap type piezoelectric resonator 7 which utilizes the thickness shear mode, is fixed by conductive adhesives 8 and 9 or other suitable fixing members.

The piezoelectric resonator 7 has a piezoelectric substrate 7a which preferably has a narrow, substantially rectangular plate-shaped configuration.

Figure 2A:
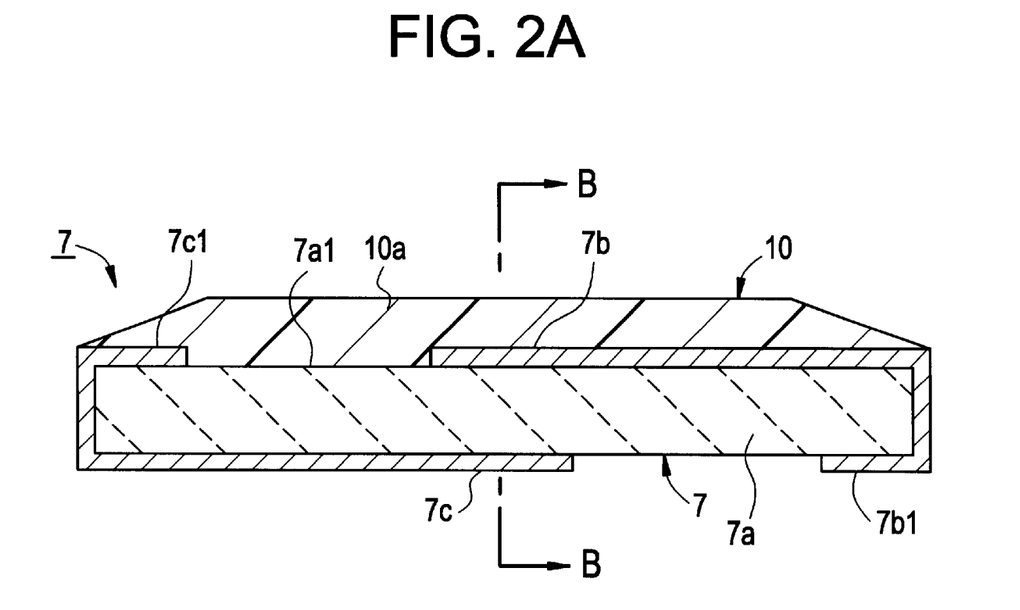
FIG. 2A is a vertical sectional view for explaining the piezoelectric component in accordance with the preferred embodiment of the present invention shown in FIG. 1.

As shown in FIG. 2A, a first vibration electrode 7b is disposed on the top surface $7a_1$, of the piezoelectric substrate 7a, and a second vibration electrode 7c is disposed on the bottom surface thereof. The vibration electrodes 7b and 7c are arranged so as to be opposed to each other at the longitudinal center area of the piezoelectric substrate 7a on the top and bottom surfaces. Also, the vibration electrode 7b and 7c are arranged so as to extend over the entire width of the piezoelectric substrate 7a.

The vibration electrode 7b is arranged so as to extend from the approximate center area of the piezoelectric substrate 7a to one end portion thereof, and further has an electrode extending portion $7b_1$ which extends to the bottom surface of the piezoelectric substrate 7a via an end surface thereof.

Likewise, the vibration electrode 7c extends from the longitudinal center area of the piezoelectric substrate 7a to the end portion opposite to the end portion on the side to which the vibration electrode 7b extends. Also, the vibration electrode 7c has an electrode extending portion $7c_1$ which extends to the top surface of the piezoelectric substrate 7a via an end surface thereof.

When the piezoelectric component 1 is produced, the piezoelectric resonator 7 is fixed onto the case board 2 preferably by the conductive adhesives 8 and 9, as shown in FIG. 1. In this case, the vibration electrode 7c is electrically connected to an electrode 4 by the conductive adhesives 8, while the vibration electrode 7b is electrically connected to an electrode 5 by the conductive adhesives 9.

Furthermore, in this preferred embodiment, the piezoelectric resonator 7 is provided with a damping member 10. While being shown in the exploded view in FIG. 1, the damping member 10 has a top surface portion 10a provided on the top surface $7a_1$ of the piezoelectric resonator 7 and side surface portions 10b and 10c provided on a pair of side surfaces $7a_2$ and $7a_3$ thereof.

Figure 2B:
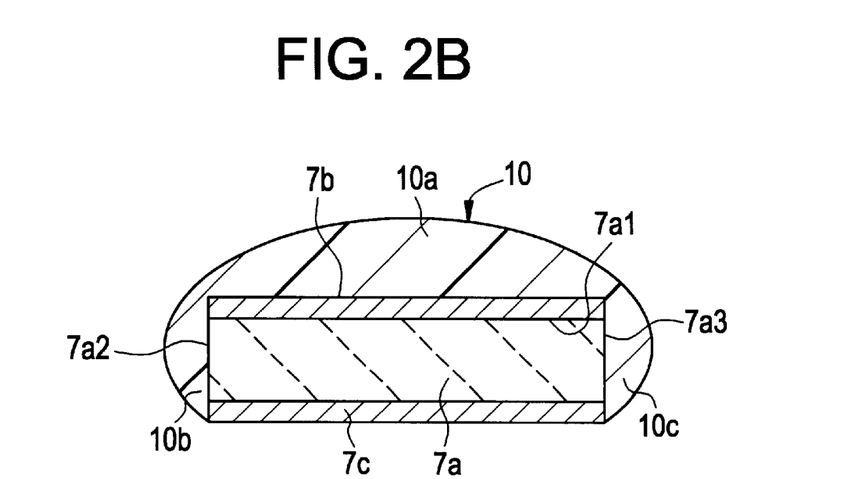
FIG. 2B is a cross-sectional view taken along a line B—B in FIG. 2A.

Although being shown in the exploded view in FIG. 1, the damping member 10 is, in reality, provided in a continuity state so as to extend from the top surface $7a_1$ of the piezoelectric resonator 7 to the pair of side surfaces $7a_2$ and $7a_3$, as shown in FIGS. 2A and 2B.

The damping member 10 may be formed using a suitable insulative resin or insulative rubber or other suitable material, each of which exerts a damping action due to the addition of mass such as a silicone rubber. It is, however, preferable to use a silicone rubber as the damping member 10, since the silicon rubber is easy to treat and exerts a superior damping performance. More preferably, a silicone rubber which has a viscosity of about 20 Pa·s or below at about 25° C., which has fluidity at about 25° C., and which is cured into a rubber-like state by heating, is preferably used.

In the piezoelectric component in accordance with this preferred embodiment, in the piezoelectric resonator 7, the damping member 10 is provided on the top surface defining one main surface of the piezoelectric resonator and the pair of side surfaces thereof. Therefore, when forming the damping member 10, the damping member 10 can be extended up to the pair of side surfaces, only by providing the damping member having a fluidity from the top surface of the piezoelectric resonator 7. In other words, one processing step is sufficient for forming the damping member 10. This results in an simplified process of forming the damping member, which leads to a reduction in the total manufacturing cost of the piezoelectric resonator 7.

The top surface portion 10a and the side surface portions 10b and 10c of the damping member 10 are required to be coated so as to cover the piezoelectric vibrating portion. That is, the top surface portion 10a and the side surface portions 10b and 10c are formed so as to coat the piezoelectric vibrating portion at which the vibration electrodes 7b and 7c are oppositely disposed. Herein, it is not necessary to form the damping member 10 over the entire area in the longitudinal direction of the piezoelectric resonator 7, so long as the damping member 10 can coat the vibrating portion, on the top surface and the side surfaces thereof.

In the piezoelectric resonator 7 in accordance with preferred embodiments of the present invention, since the damping member 10 is arranged so as to extend not only to the top surface $7a_1$ of the piezoelectric resonator 7 but also to the pair of side surfaces $7a_2$ and $7a_3$ thereof, unwanted vibrations in a width mode in the piezoelectric resonator 7 using the piezoelectric substrate 7a are effectively suppressed. Therefore, in the piezoelectric resonator 7, when a band pass filter is defined by transforming the structure of the vibration electrodes, ripples in the pass band are minimized. Also, when a piezoelectric trap filter is produced, the disturbances in group delay characteristics in the pass band are prevented. In addition, when a discriminator is produced, low distortion-factor characteristics can be achieved. These will be described below based on specific experimental examples.

When forming the piezoelectric resonator 7 in accordance with the above-described preferred embodiments, a discriminator was constructed by forming vibration electrodes 7b and 7c on a piezoelectric substrate 7a which is constituted of PZT-based ceramic, and which has approximate dimensions of 3 mm (length)×0.4 mm (width)×0.1 mm (thickness). Using a dispenser, the piezoelectric resonator 7 defining a discriminator was provided with a thermosetting silicone rubber of which the viscosity at about 25° C. before curing was about 8 Pa·s. Then, the silicone rubber was cured at approximately 150° C., and the damping member 10 was thus formed. The hardness of the damping member 10 constituted of the silicone rubber after curing, was about 60 of JIS-A hardness.

Figure 7:
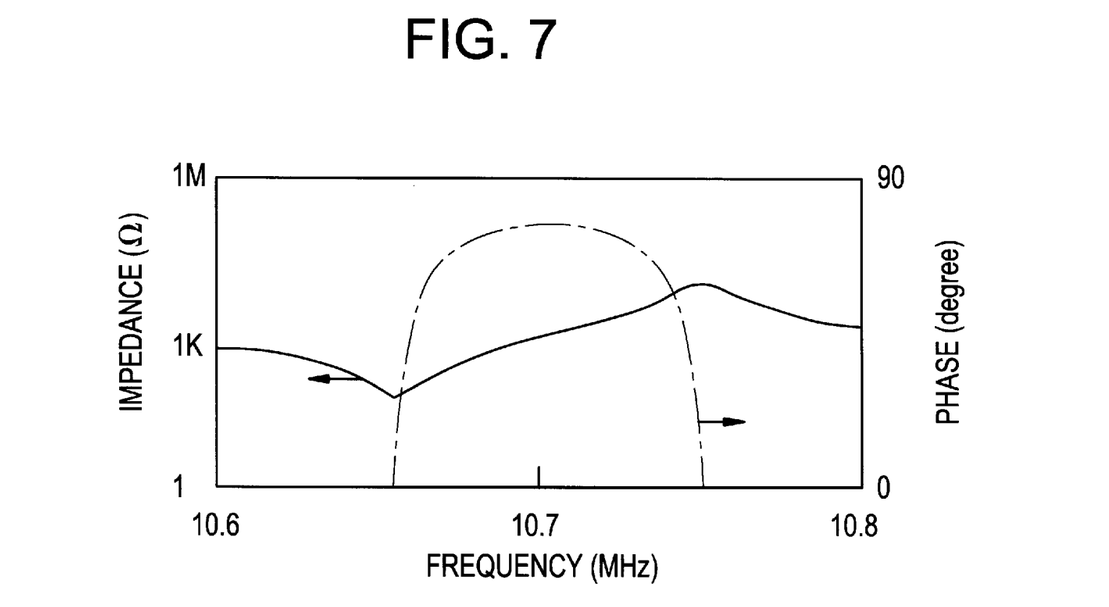
FIG. 7 is a diagram showing the impedance characteristics and the phase characteristics of a discriminator formed according to a preferred embodiment of the present invention.

FIG. 7 shows the impedance characteristics and the phase characteristics of the discriminator obtained in this example.

Figure 8:
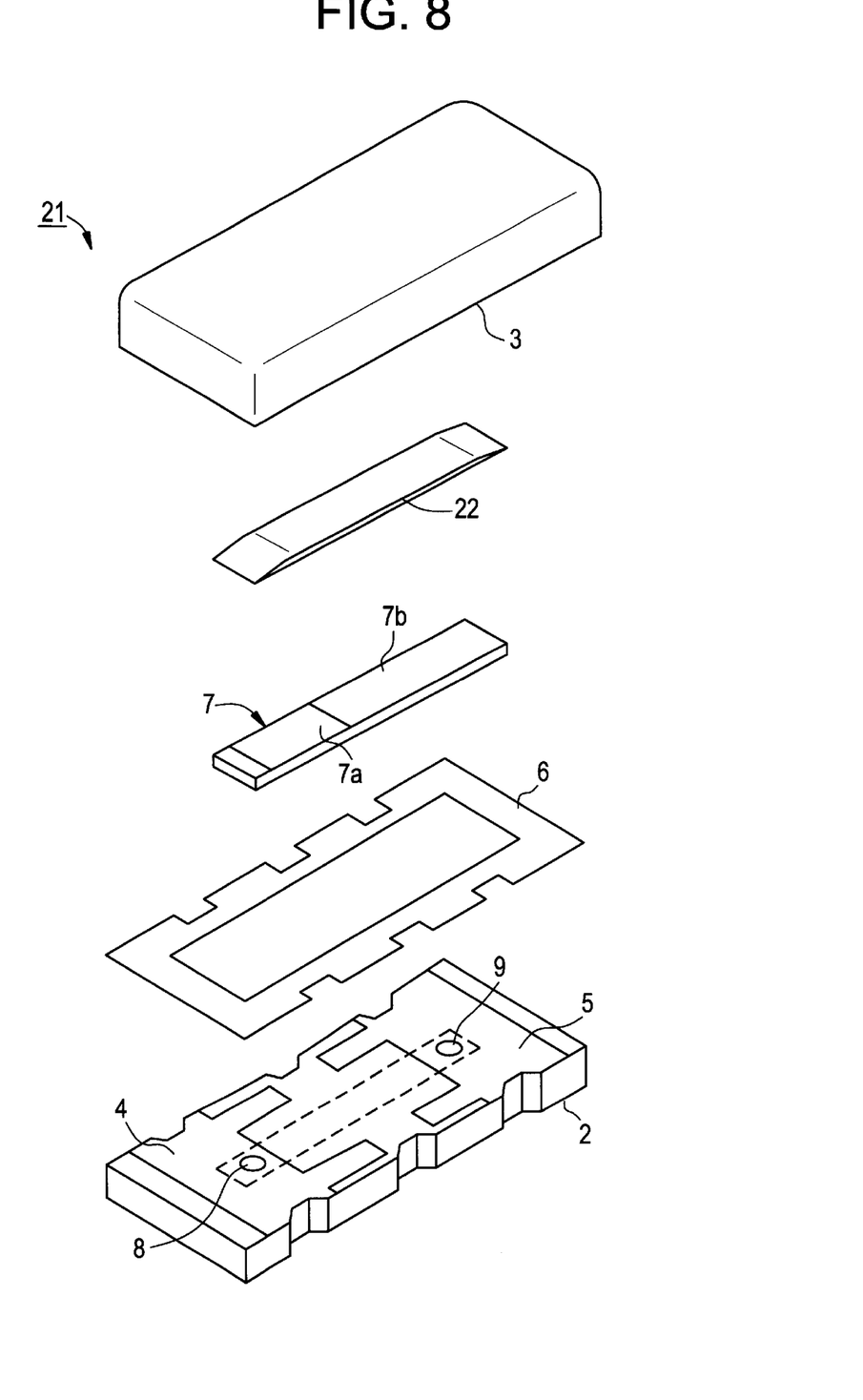
FIG. 8 is an exploded perspective view for explaining a piezoelectric component prepared for comparison to preferred embodiments of the present invention.

For comparison, a piezoelectric component 21 shown in FIG. 8 was prepared. The piezoelectric component 21 was formed by the same method as that for the above-described preferred embodiment, except that the piezoelectric component 21 was provided with the damping member 22 only on the top surface of the piezoelectric resonator 7.

Figure 9:
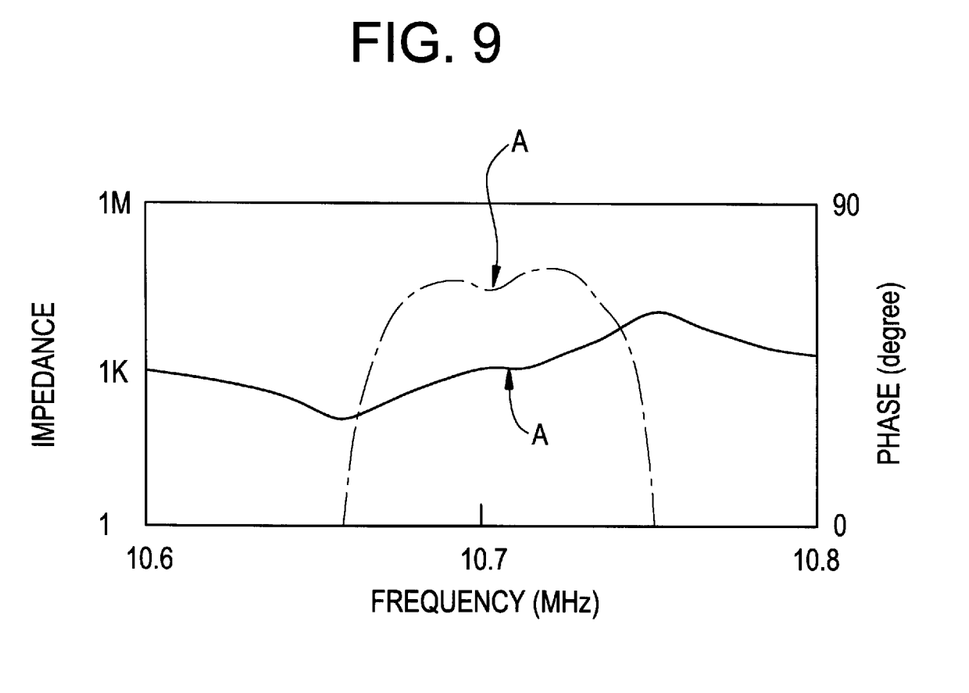
FIG. 9 is a diagram showing the impedance characteristics and the phase characteristics of a discriminator prepared for comparison to preferred embodiments of the present invention.

FIG. 9 shows the impedance characteristics and the phase characteristics of the piezoelectric component 21 prepared for comparison. The piezoelectric component 21 shown in FIG. 8 has the structure disclosed in unknown Japanese Patent Application No. 11-134018 previously proposed by the inventor of this application. Even in this piezoelectric component 21 prepared for comparison, the damping member 22 can be applied by applying the damping member only from one main surface of the piezoelectric resonator 7. However, as shown in FIG. 9, in the comparative example of piezoelectric component, relatively large ripples indicated by an arrow A are observed. These are ripples due to the width mode.

In contrast, as is evident from FIG. 7, in the piezoelectric component 1 using the piezoelectric resonator 7 in accordance with this example of preferred embodiments of the present invention, ripples in the width mode are effectively suppressed.

That is, in the piezoelectric component 1 in accordance with this preferred embodiment, since the damping member 10 is also provided on the side surfaces of the piezoelectric resonator 7, ripples in the width mode can be effectively inhibited.

In the piezoelectric component disclosed in Japanese Patent Application No. 11-134018, defective components due to ripples in the width mode have occurred about 5 percent of the time, whereas the piezoelectric component 1 in accordance with this example of preferred embodiments eliminated such defective components due to large ripples in the width mode. This results in a greatly improved productivity rate of piezoelectric components.

Also, in the piezoelectric component disclosed in Japanese Patent Application No. 11-134018, it is necessary to use a damping member having 80 to 100 of JIS-A hardness, in order to reduce the distortion factor when a discriminator is formed. However, in this preferred embodiment, even when using a silicone rubber having about 60 of JIS-A hardness as described above, the distortion factor is greatly reduced. Hence, the range of choices of material usable as a damping member can be extended in preferred embodiments of the present invention. This allows more inexpensive piezoelectric resonators to be produced.

Next, specific examples of the method for providing the piezoelectric resonator 7 with the damping member 10 will be described with reference to FIGS. 3 through 6.

Figure 3:
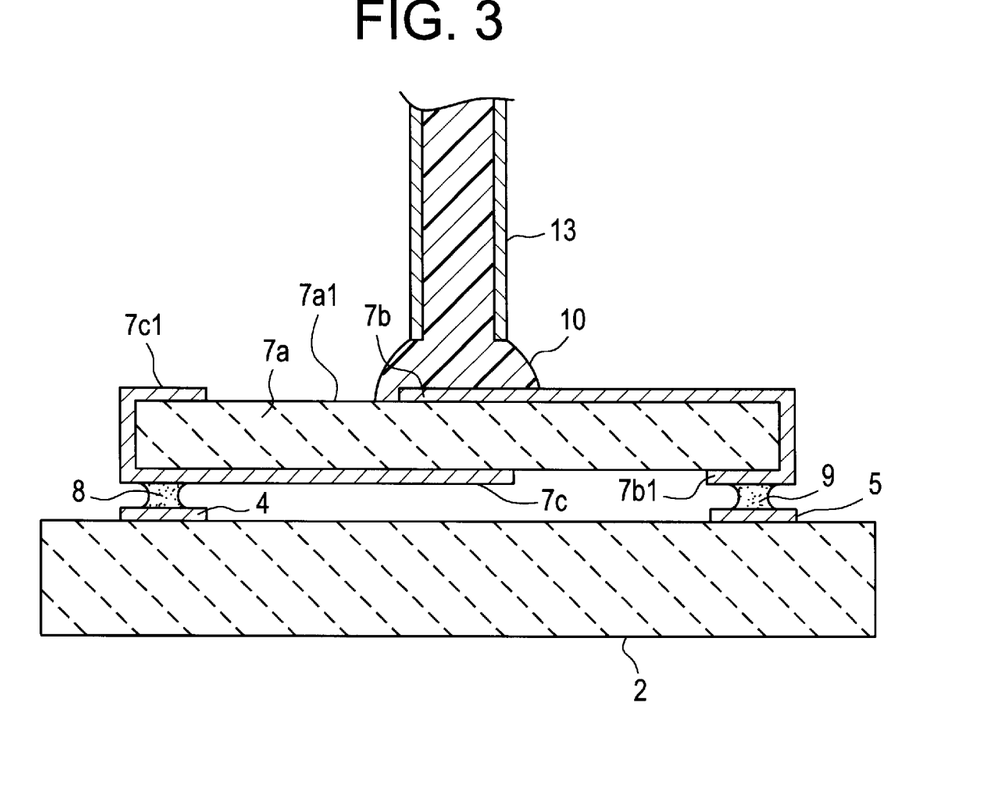
FIG. 3 is a vertical sectional view for explaining the process of providing a damping member using a dispenser in preferred embodiments of the present invention.
Figure 4:
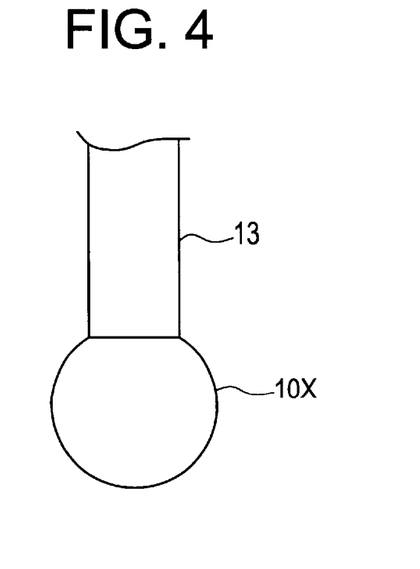
FIG. 4 is a partially broken plan view showing the damping member drooping from the nozzle tip of the dispenser.

As described above, when attempting to provide the damping member 10 using a dispenser, as shown in the vertical sectional view in FIG. 3, the damping member 10 charged in the nozzle 13 only has to be provided from the top surface side of the piezoelectric resonator 7 by lowering the nozzle 13 of the dispenser from above the piezoelectric resonator 7. In this case, preferably, the outer diameter D of the tip of the nozzle 13 is not smaller than the width W of the piezoelectric substrate 7a constituting the piezoelectric resonator 7. As shown in FIG. 4, the damping member drooping from the nozzle tip, that is, the drooping portion 10× of the damping member 10 bulges into a substantially spherical shape. When the outer diameter D of the nozzle 13 is not smaller than the width W, the diameter of this drooping portion 10× which has bulged into a substantially spherical shape becomes much larger than the width W of the piezoelectric substrate 7a, so that the damping member 10 can be applied so as to extend up to the pair of side surfaces of the piezoelectric substrate 7a (see FIG. 5A).

Figure 5A:
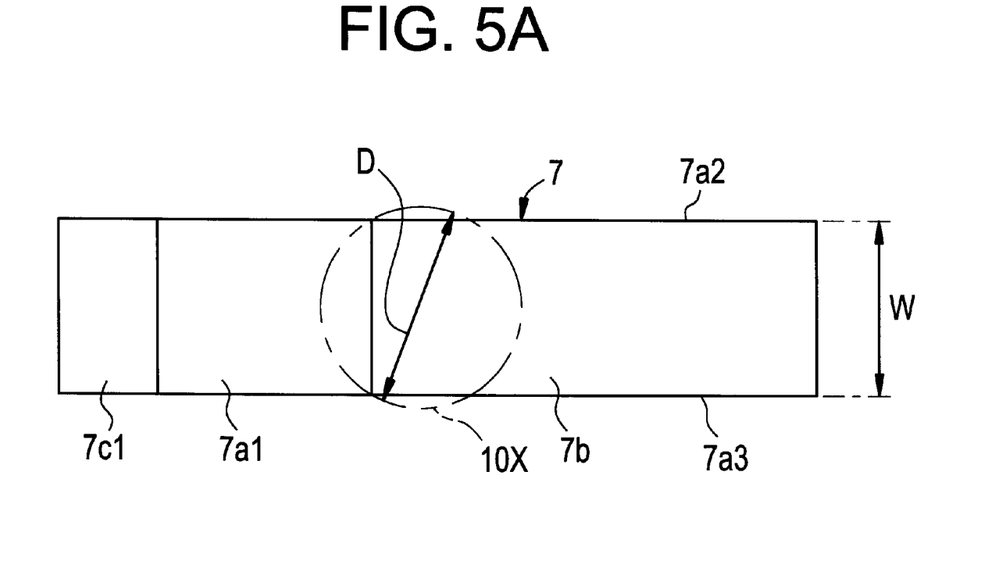
FIG. 5A is a schematic plan view showing the relationship between a piezoelectric substrate and the drooping portion of the damping member.
Figure 5B:
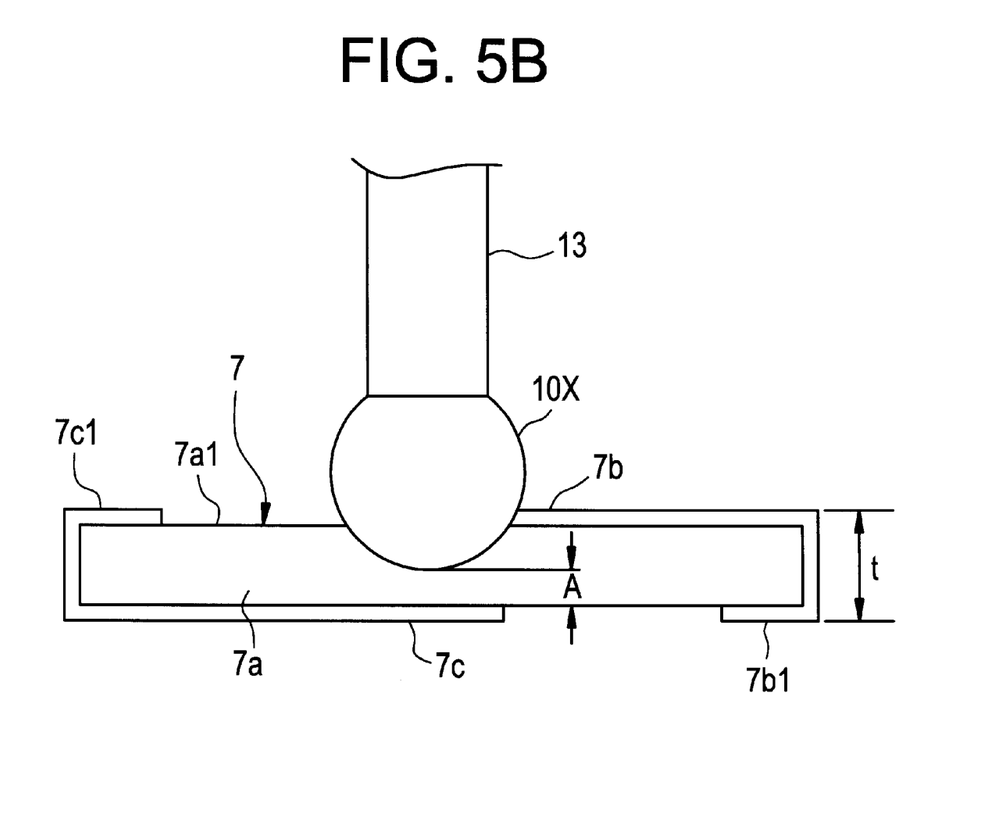
FIG. 5B is a view showing the relationship between the drooping portion of the damping member and the thickness of the piezoelectric substrate when the piezoelectric substrate is coated.
Figure 6:
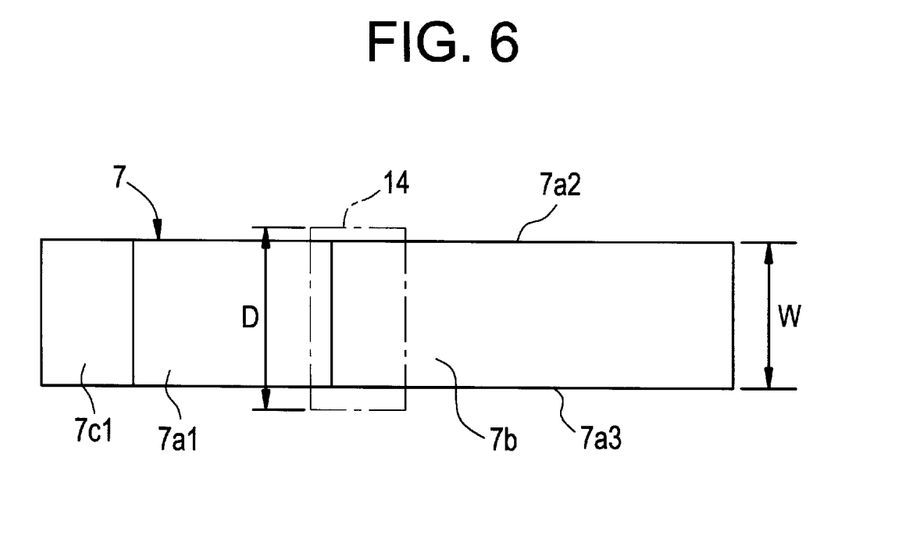
FIG. 6 is a schematic plan view for explaining the relationship between the tip of a transfer pin and the widthwise dimension of the piezoelectric substrate when the transfer pin is used.

Also, preferably, the damping member 10 is applied so that the distance A between the lower end of the drooping portion 10× and the bottom surface of the piezoelectric substrate 7a is in the range of $0 \leq A \leq t$, where t is the thickness of the piezoelectric substrate 7a.

When applying the damping member 10 as described above, where the drooping portion contacts the top surface of the piezoelectric resonator 7, and also extends up to the side surfaces due to the fluidity thereof, the damping member 10 can also be provided on the pair of side surfaces of the piezoelectric resonator 7, with reliability, by providing the damping member 10 so as to satisfy the relationship $0 \leq A \leq t$, at the portion where the lower end of the drooping portion 10× extends to the side surfaces, and by thereafter curing the damping member 10.

In the above-described preferred embodiment, the damping member 10 is provided on the piezoelectric resonator 7 by feeding the damping member 10 out of the nozzle 13 of the dispenser. However, a transfer pin may be used instead of the dispenser. In this case, as shown in the schematic plan view in FIG. 6, it is essential only that the diameter D of the transfer pin 14 is not smaller than the width W of the piezoelectric resonator 7. Thereby, as in the case where the dispenser is used, the damping member 10 can be reliably provided not only on the top surface of the piezoelectric resonator 7, but also on the pair of side surfaces thereof.

In the above-described preferred embodiment, the case board 2 and the cap 3 preferably define the first and second case members 2 and 3, respectively, but the shapes of the first and second case members are not limited to the shapes in the above-described preferred embodiment, so long as an accommodating space which is capable of accommodating the piezoelectric resonator 7 is ensured.

Also, in the above-described preferred embodiment, descriptions have been made of the piezoelectric resonator wherein a pair of vibration electrodes are disposed on a piezoelectric substrate, but the present invention may be applied to the piezoelectric resonator wherein at least two pair of vibration electrodes are provided on a piezoelectric substrate. Furthermore, the present invention may be applied to the piezoelectric component which accommodates at least two piezoelectric resonators (piezoelectric substrates) in an accommodating space.

As is evident from the foregoing description, the piezoelectric resonator in accordance with preferred embodiments of the present invention has a damping member which is provided on one main surface and a pair of side surfaces connecting the two main surfaces, and which is provided so as to coat the vibrating portion only on the one main surface and the pair of side surfaces, so that the damping member has only to be applied from the one main surface side when attempting to apply the damping member. This allows the application process for the damping member to be simplified, which results in an reduced production cost of a piezoelectric resonator.

In addition, since the damping member coats the vibrating portion not only on the one main surface of the piezoelectric resonator but also on the pair of side surfaces thereof, the damping member effectively eliminates ripples in the width mode, and enables a piezoelectric resonator which has superior frequency characteristics to be provided. For example, the distortion factor is minimized when a discriminator is formed, the disturbance in group delay characteristics in the pass band is minimized when a filter is formed, and ripples in an impedance waveform are inhibited when a resonator is formed.

When, as a damping member, a silicone rubber is used which has a viscosity of about 20 Pa·s or below at approximately 25° C., which has fluidity at about 25° C., and which is cured into a rubber-like state by heating, the damping member can be applied to the one main surface and the pair of side surfaces of the piezoelectric resonator at room temperature with ease and reliability, and exerts a superior damping action after curing.

In the piezoelectric component in accordance with preferred embodiments of the present invention, since the piezoelectric resonator in accordance with the present invention is accommodated in the accommodating space defined by and within the interior of the first and second case members, and the piezoelectric resonator is fixed on one of the first and second cases so as not to hinder vibrations of the piezoelectric vibrating portion, it is possible to provide a case-sealed type piezoelectric component which has an excellent environmental resistance, and which is inexpensive and superior in frequency characteristics in accordance with the present invention.

In the method of manufacturing the piezoelectric resonator in accordance with various preferred embodiments of the present invention, since the damping member has only to be applied from one main surface of the piezoelectric resonator utilizing the thicknesswise shear mode so as to coat the piezoelectric vibrating portion only on the one main surface and both side surfaces, simplification of the application process for the damping member is achieved, and also the frequency characteristics of the piezoelectric resonator are greatly improved.

The application of the damping member can be executed through the use of a nozzle or a transfer pin. The damping member, therefore, can be easily applied using a nozzle or a transfer pin without the need of a new particular application facility or apparatus.

Where the widthwise dimension of the piezoelectric substrate is W, when using the nozzle or the transfer pin each of which has an outer diameter or a diameter not smaller than the above-mentioned widthwise dimension W, the damping member can be reliably applied so as to extend not only to the one main surface of the piezoelectric substrate but also to the pair of side surfaces thereof, only by providing the damping member on the one main surface side of the piezoelectric substrate, upon bringing the nozzle or the transfer pin close thereto.

Furthermore, where the distance between the lower end of the portion where the damping member droops from the tip of the nozzle or the transfer pin and the main surface opposite to the main surface on the side to which the damping member of the piezoelectric substrate is to be applied, is A, and the thickness of the piezoelectric substrate is t, when the damping member is provided so as to satisfy the relationship $0 \leq A \leq t$, the damping member can be reliably applied not only to the one main surface of the piezoelectric substrate but also to the pair of side surfaces thereof.

While the present invention has been described with reference to what are at present considered to be preferred embodiments, it is to be understood that various changes and modifications may be made thereto without departing from the invention in its broader aspects and therefore, it is intended that the appended claims cover all such changes and modifications as fall within the true spirit and scope of the invention.

What is claimed is:

1. An energy-trap type piezoelectric resonator which utilizes a thickness vibration shear mode, said piezoelectric resonator comprising:

a piezoelectric substrate having first and second main surfaces;

at least a pair of vibration electrodes disposed on portions of said first and second main surfaces, respectively, of said piezoelectric substrate, which are disposed so as to be opposed to each other, and which constitute a vibrating portion; and a damping member arranged to cover the vibrating portion only on one main surface of said piezoelectric resonator and a pair of side surfaces connecting the first and second main surfaces thereof.

2. A piezoelectric resonator as claimed in claim 1, wherein said damping member includes silicone rubber which has a viscosity of about 20 Pa·s or below at approximately 25° C., which has fluidity at about 25° C., and which is cured into a rubber-like state by heating.

3. A piezoelectric resonator as claimed in claim 1, wherein the piezoelectric substrate has a narrow, substantially rectangular plate-shaped configuration.

4. A piezoelectric resonator as claimed in claim 1, wherein the pair of vibration electrode are arranged to extend over the entire width of the piezoelectric substrate.

5. A piezoelectric resonator as claimed in claim 1, wherein a first of the pair of vibration electrodes is arranged so as to extend from the approximate center area of the piezoelectric substrate to a first end portion thereof, and includes an electrode extending portion which extends to the bottom surface of the piezoelectric substrate via a first end surface thereof.

6. A piezoelectric resonator as claimed in claim 5, wherein a second of the pair of vibration electrodes extends from the longitudinal center area of the piezoelectric substrate to a second end portion opposite to the first end portion and includes an electrode extending portion which extends to the top surface of the piezoelectric substrate via a second end surface thereof.

7. A piezoelectric resonator as claimed in claim 1, wherein the damping member includes at least one of resin and rubber.

8. A piezoelectric component, comprising:

a piezoelectric resonator according to claim 1;

first and second case members which are bonded to each other, and in which a space for accommodating said piezoelectric resonator is provided; and said piezoelectric resonator being fixed on one of said first and second case members so as not to hinder vibrations of the piezoelectric vibrating portion.

9. The piezoelectric component according to claim 8, wherein the first case member is made of one of an insulative ceramic and a conductive material and the second case member is made of metal.

10. The piezoelectric component according to claim 8, further comprising a first electrode and a second electrode provided on the case, and conductive adhesives arranged to electrically connect a first of the pair of vibration electrodes to the first electrode and to electrically connect a second of the pair of vibration electrodes to the second electrode.

11. The piezoelectric component according to claim 8, wherein the piezoelectric component is one of a band pass filter, a piezoelectric trap filter, and a discriminator.

12. A piezoelectric component as claimed in claim 8, wherein said damping member includes silicone rubber which has a viscosity of about 20 Pa·s or below at approximately 25° C., which has fluidity at about 25° C., and which is cured into a rubber-like state by heating.

13. A piezoelectric component as claimed in claim 8, wherein the pair of vibration electrode are arranged to extend over the entire width of the piezoelectric substrate.

14. A piezoelectric component as claimed in claim 8, wherein a first of the pair of vibration electrodes is arranged so as to extend from the approximate center area of the piezoelectric substrate to a first end portion thereof, and includes an electrode extending portion which extends to the bottom surface of the piezoelectric substrate via a first end surface thereof.

15. A piezoelectric component as claimed in claim 14, wherein a second of the pair of vibration electrodes extends from the longitudinal center area of the piezoelectric substrate to a second end portion opposite to the first end portion and includes an electrode extending portion which extends to the top surface of the piezoelectric substrate via a second end surface thereof.

16. A piezoelectric component as claimed in claim 8, wherein the damping member includes at least one of resin and rubber.

17. A method for producing a piezoelectric resonator, comprising the steps of:
   preparing an energy-trap type piezoelectric resonator which utilizes the thickness shear vibration mode, and in which the vibration electrodes are each disposed on the first and second main surfaces thereof; and
   applying a damping member from one main surface side of said piezoelectric resonator, and forming said damping member so as to coat the vibrating portion only on the one main surface and both side surfaces.

18. A method for producing a piezoelectric resonator as claimed in claim 17, wherein the step of applying said damping member is performed using one of a nozzle and a transfer pin.

19. A method for producing a piezoelectric resonator as claimed in claim 17, wherein the nozzle and the transfer pin which satisfies the relationship $D \geq W$ is used, when the widthwise dimension of said piezoelectric substrate is W, and the outer diameter of said nozzle or the diameter of said transfer pin is D, at the portion where the damping member droops from the tip of said nozzle or said transfer pin.

20. A method for producing a piezoelectric resonator as claimed in claim 17, wherein said damping member satisfies the relationship $0 \leq A \leq t$, when the distance between the lower end of the portion where the damping member droops from the tip of said nozzle or said transfer pin and the main surface opposite to the main surface on the side to which the damping member for the piezoelectric substrate is to be applied, is A, and the thickness of said piezoelectric substrate is t.

* * * * *